United States Patent [19]
Hatano et al.

[11] Patent Number: 5,124,583
[45] Date of Patent: Jun. 23, 1992

[54] DC-POWERED JOSEPHSON INTEGRATED CIRCUIT

[75] Inventors: Yuji Hatano, Kodaira; Shinichiro Yano; Hiroyuki Mori, both of Hachioji; Hirozi Yamada, Kanagawa; Mikio Hirano, Ome, all of Japan

[73] Assignee: Hitachi, Ltd., Tokyo, Japan

[21] Appl. No.: 650,933

[22] Filed: Feb. 5, 1991

[30] Foreign Application Priority Data

Feb. 9, 1990 [JP] Japan .................................. 2-028550

[51] Int. Cl.⁵ .................... H03K 3/38; H03K 17/92; H03K 19/195
[52] U.S. Cl. .................... 307/476; 307/277; 307/306; 505/861; 505/865
[58] Field of Search ............... 307/306, 462, 476, 297; 505/846, 861, 864, 865, 874; 357/5

[56] References Cited
U.S. PATENT DOCUMENTS 3,953,749  4/1976  Baechtold et al. ................. 307/462

OTHER PUBLICATIONS

A. F. Hebard, S. S. Pei, L. N. Dunkleberger, and T. A. Fulton; "A DC-powered Josephson Flip-Flop", IEEE Trans. on Magnetics, vol. MAG. 15, pp. 408-411, Jan. 1979.

H. Suzuki et al., "Josephson IC-Semiconductor IC Interface Circuit", prepared for All-Japan Spring Metting of the Institute of Electronics and Communication Engineers of Japan (1989), No. SC-3-8, pp. 357-358.

Primary Examiner—John Zazworsky
Attorney, Agent, or Firm—Kenyon & Kenyon

[57] ABSTRACT

A DC powered integrated circuit includes a plurality of magnetic flux coupling type Josephson elements. First and second Josephson elements are connected in series to form a first element series circuit of Josephson elements. Third and fourth Josephson elements are connected in series to form a second element series circuit of Josephson elements. The first and second element series circuits are connected in series to form a huffle circuit, with a load inductance, three resistors and a DC current source.

9 Claims, 18 Drawing Sheets $Q = S \cdot A + \overline{S} \cdot B$

Q=A·B+B·C+C·A

OUT = A·B OR A+B

F I G. 12
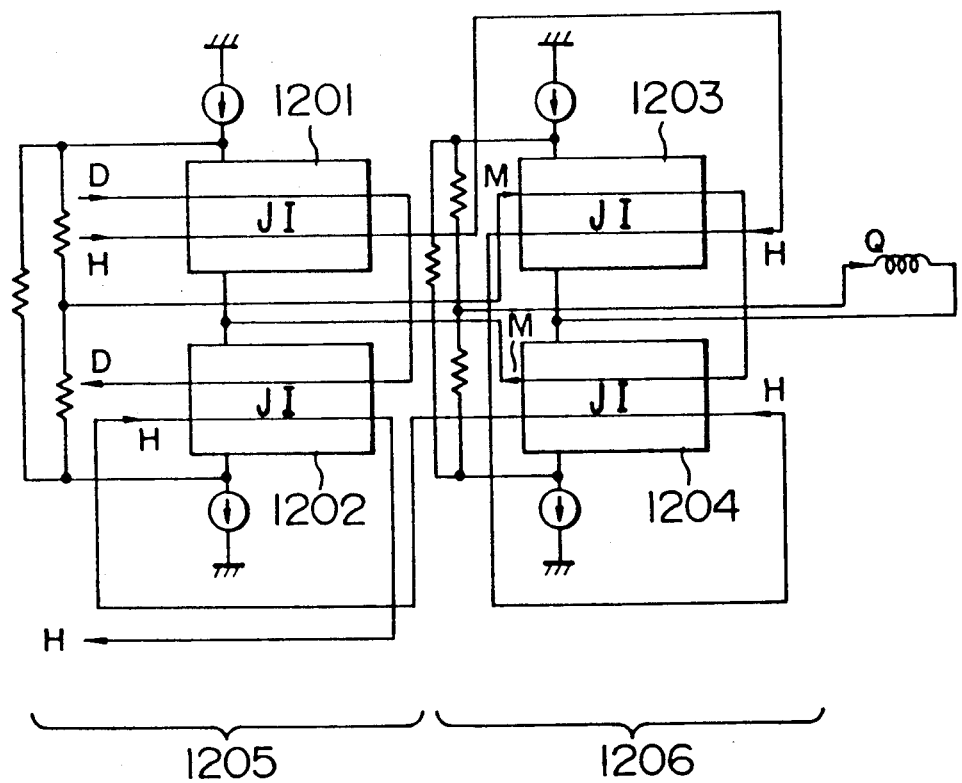

F I G. 14
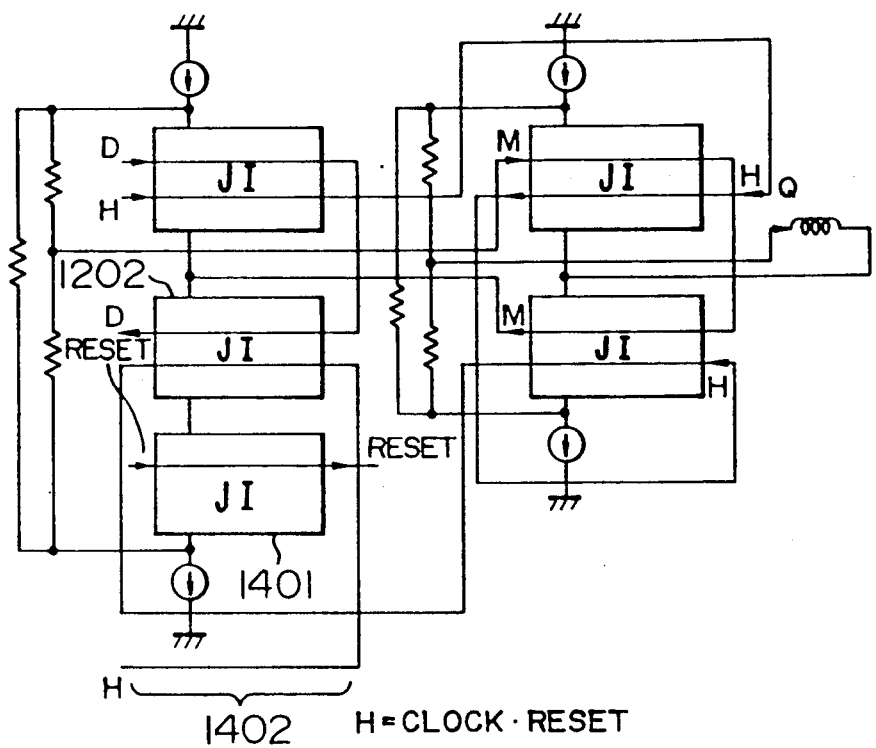
H = CLOCK · RESET
F I G. 15
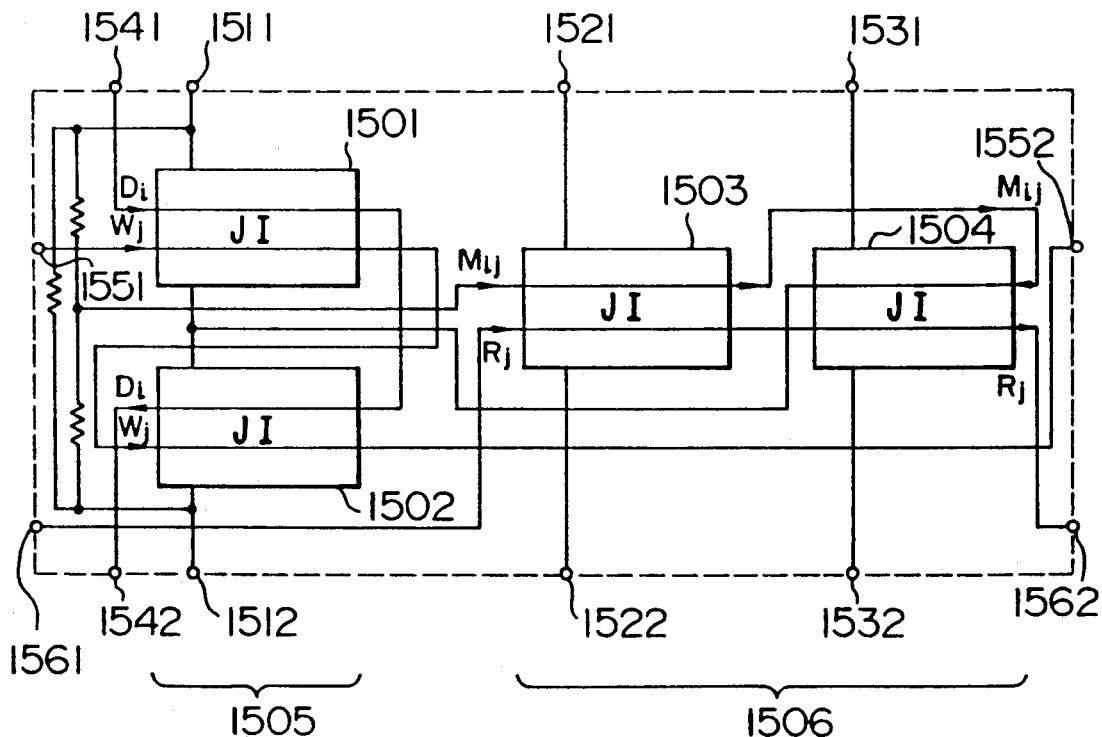

FIG. 23A PRIOR ART
FIG. 23B
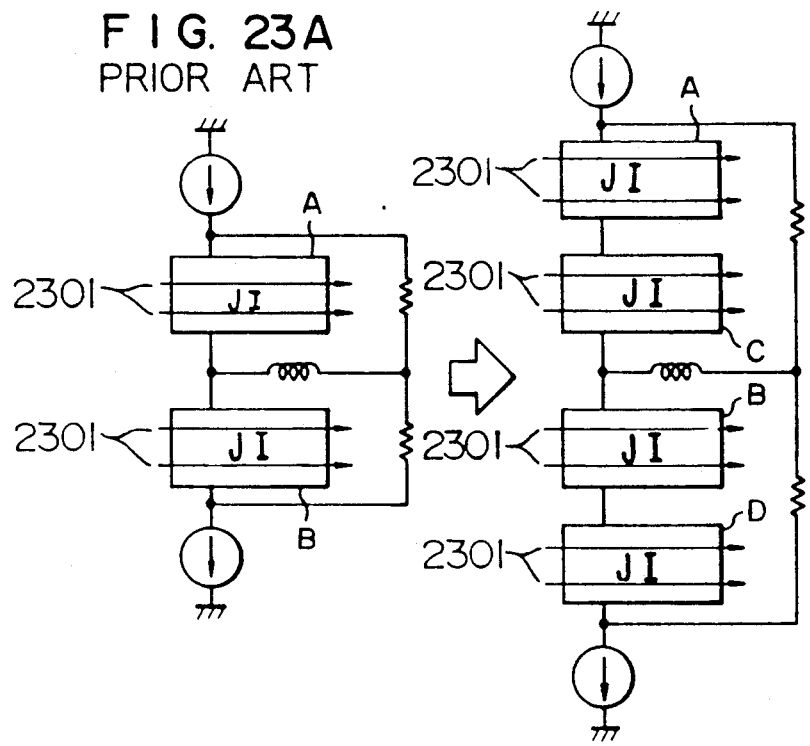
FIG. 23C
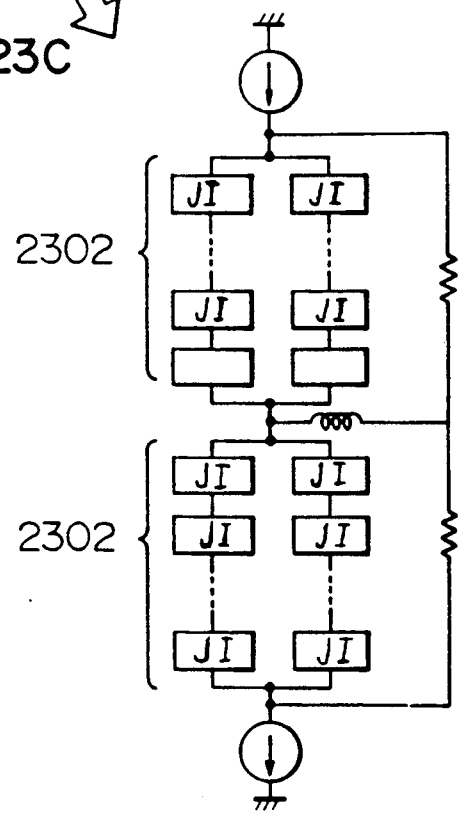

1

DC-POWERED JOSEPHSON INTEGRATED CIRCUIT

BACKGROUND OF THE INVENTION

This invention relates to Josephson logic circuits, and particularly to a DC-powered Josephson integrated circuit.

The structure of a typical conventional DC-powered Josephson logic circuit is described in detail by A.F. Hebard, S.S. Pei, L.N. Dunkleberger, and T.A. Fulton in a paper titled "A DC Powered Josephson Flip-Flop" IEEE Trans. on Magnetics, Vol. MAG-15, pp. 408-411, Jan., 1979.

FIG. 21 shows the structure of the circuit disclosed in the paper by A.F. Hebard and others. FIG. 21, shows two magnetic flux coupling type Josephson elements 2101 and 2102 which are connected in series. These elements are set to such operating conditions that when one of the elements is switched from a superconducting state to a voltage state, the other element is switched reversely from the voltage state to the superconducting state as a reaction to the former switching action, thereby realizing the DC-powered operation. The DC-powered circuit of this arrangement is called a "huffle circuit". In addition, as illustrated, these two Josephson elements are each provided with a plurality of control input lines 2103, and the threshold value logic functions of both elements to each input are utilized to realize a DC-powered OR gate or AND gate.

Two magnetic flux coupling type Josephson elements according to the A.F. Hebard system can make an OR gate or an AND gate. On the other hand, when an exclusive OR gate is realized by a combination of OR gates and AND gates, two OR gates and one AND gate or one OR gate and two AND gates are necessary. Therefore, 6 Josephson elements in total are necessary for an exclusive OR gate, and 2 switching stages are constructed from the input to the output. For high-density integration and high-speed operation of the circuits, it is of course desired to reduce the number of these elements and switching stages.

On the other hand, from the output amplitude point of view, it is possible to derive a current amplitude of several tens of microampere ($\mu A$) to several milliampere (mA) from a load inductance by adjusting the threshold characteristics of the Josephson elements. However, the output voltage depends on the electrode material of the Josephson junction. When the Josephson junction is made of a typical niobium-based material, the output voltage is limited to about 2 mV across a load resistor 2106 or 2107. Thus, there is the problem that the direct interface to a semiconductor circuit is difficult.

Two series circuits, each of a plurality of Josephson elements, are connected in parallel and an amplified voltage is derived from the opposite ends of the parallel circuit as described in a paper titled "Josephson IC-Semiconductor IC Interface Circuit" written by Hideo Suzuki, Atuki Inoue, Takeshi Imamura, Nobuya Hasuo and others, in All Japan Spring Meeting of the Institute of Electronics and Communication Engineers of Japan (1989), No. SC-3-8, pp. 5-357 to 358. FIG. 22 shows this circuit arrangement, in which a series output voltage of about 150 mV can be derived from the output end of 52 series-connected Josephson junctions 2201. However, this circuit is driven by an AC power supply, and a method for deriving a high voltage from a DC-powered circuit is not known yet.

Thus, there are still problems in high-density integration and high-speed operation of Josephson elements and in the interface of such elements to semiconductor circuits.

SUMMARY OF THE INVENTION

Accordingly, the present invention provides a DC-powered logic gate which is capable of being integrated at a high density and made of a small number of elements and switching stages for realizing high-speed operation.

The present invention to also provides a DC powered gate capable of producing a high output voltage for easy interface of the DC-powered Josephson circuit to semiconductor circuits.

In order to achieve these ends a DC-powered Josephson integrated circuit is so arranged that the Josephson elements of the huffle circuit are respectively first and second element series circuits each of a plurality of magnetic flux coupling type Josephson elements thus, a DC-powered gate of only one stage for various different logic functions can be realized by varying the combination of input signals to the control input lines of the Josephson elements. Therefore, this arrangement makes it easy to integrate at a high density and operate at high speed the DC-powered logic gate using Josephson elements.

In this case, it is preferable to construct the magnetic flux coupling type Josephson element as a magnetic flux quantum interference type Josephson element (Josephson interferometer element) to which external control signals and a DC bias current are simultaneously supplied.

This further facilitates the high integration and high-speed operation.

The control signals to the control input lines of each Josephson element are desired to control any one of the Josephson elements of the first element series circuit placing it in the voltage state and all the Josephson elements of the second element series circuit are made to be in the superconducting state.

In this case, it is preferable that when the control signals to the control input lines of the respective Josephson elements are all "1", a DC bias current flc·· so that the Josephson elements are made to be in th· ;t-age state.

The control means to the respective Josephson elements is satisfactory not only for the element series circuits but also to realize the DC-powered gate of a single stage for various different logic functions.

Another DC-powered Josephson integrated circuit of this invention has the feature that the Josephson elements in the huffle circuit are respectively first and second element series-parallel circuits each having a plurality of magnetic flux coupling type Josephson elements including at least one Josephson interferometer element connected in series and in parallel.

This makes it possible to realize a DC-powered gate capable of producing a high output voltage. Thus, this means facilitates the interface between the DC-powered Josephson circuit and a semiconductor circuit.

The basic action of this invention will be described with reference to FIGS. 23A, 23B and 23C. Two magnetic flux coupling type Josephson elements for complementary switching in the conventional huffle circuit shown in FIG. 23A are represented by A and B. Here, it is assumed that as for example shown in FIG. 23B the series circuit of two magnetic flux coupling type Josephson elements A and C is substituted for A and the series circuit of two magnetic flux coupling type Josephson elements B and D is substituted for B. In this arrangement, if the Josephson element A or C is in the voltage state, or "1", the elements B and D are controlled to be in the superconducting state. The DC-powered gate then produces an output of "1" in this condition depending on the direction of current flowing in the coil. Furthermore, if the elements A and C are also controlled to be in the superconducting state when either one of the Josephson elements B and D is "1", the direction of the current in the coil is reversed to the above with the result that the DC-powered gate produces output of "0" when the latter state occurs. Therefore, all the DC-powered gate has OR function to the operation of each element, i.e., when either A or C is "1" the output is "1" and when "A" and "C" are "0" the output is "0". Furthermore, the gate output is an inverse OR for the elements B and D where when "B" or "D" is "1" the output is "0" and when both "B" and "D" are "0" the output is "1".

At least one of the elements A, B, C and D is a Josephson element to which a plurality of signals and a DC bias current are supplied. If the element is supplied with a DC bias current so as to be switched to the voltage state when a plurality of input signals thereto are all "1", it can function as an AND gate to a plurality of input signals. Thus, this DC-powered gate having such construction and supplied with the control signals has a two-stage logic level function of "OR function between the results of AND functions". Accordingly, by changing the combination of input signals to a plurality of control input lines of each element it is possible to realize a one-stage DC-powered gate for various different logic functions including the exclusive logic sum of two input signals as for example shown in FIG. 23B.

In this case, if the magnetic flux coupling type Josephson element is replaced by a small-junction area magnetic flux quantum interference type Josephson element of this kind, or Josephson interferometer element, the switching speed and the integration density can be increased.

Again, the two magnetic flux coupling type Josephson elements for complementary switching in the previous given huffle circuit shown in FIG. 23A are represented by A and B. These Josephson elements are replaced by element series-parallel circuits 2302 each having a plurality of magnetic flux coupling type Josephson elements connected in series and in parallel as shown in FIG. 23C so that an output voltage corresponding to multiple times that of one Josephson element can be produced, or that the output voltage of the whole DC-powered gate can be increased.

It is known that use of only a series circuit of Josephson elements cannot shift all the Josephson elements to the voltage state. A parallel circuit of series circuits of Josephson elements must be provided so that all the elements can be shifted to the voltage state by the transient phenomenon after one element switches.

In the actual arrangement, the series-parallel circuit of Josephson elements includes at least one Josephson interferometer element and all elements are switched to the voltage state by the transient phenomenon when an input signal is supplied to the control input line of this element so that the element is switched.

In other words, according to the above feature, it is possible to realize a DC-powered gate capable of producing a high output voltage and make the interface thereof to a semiconductor circuit easy.

BRIEF DESCRIPTION OF THE DRAWINGS

FIG. 12 is a construction diagram of the one-bit latch of the present invention.

FIG. 14 is a construction diagram of the reset function added latch of the present invention.

FIG. 15 is a construction diagram of the matrix elements of the present register file of the invention.

FIGS. 23A, 23B and 23C show the principle of the action of the DC-powered circuit and the voltage amplifying circuit of the present invention.

DETAILED DESCRIPTION OF PREFERRED EMBODIMENTS

Figure 1:
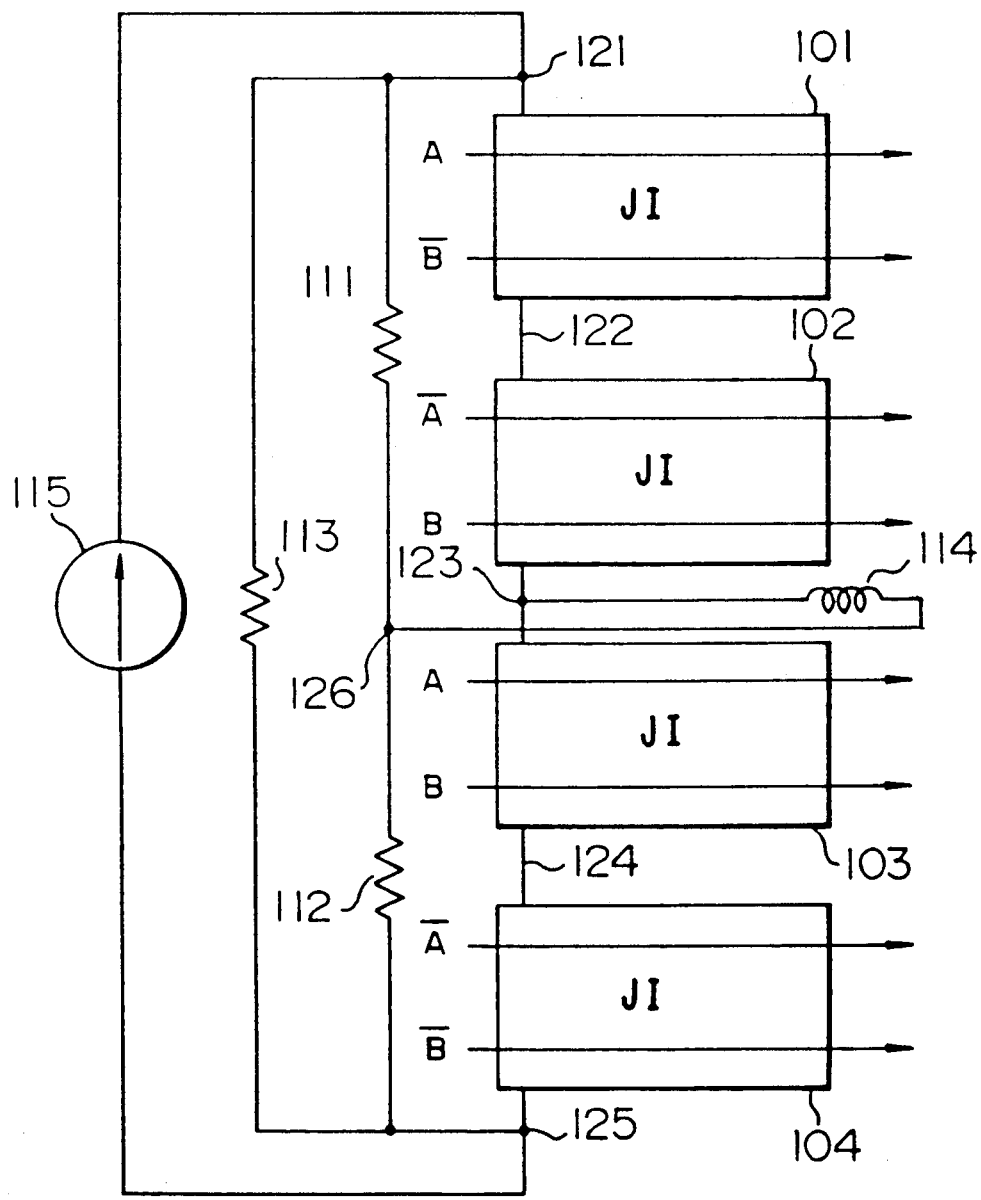
FIG. 1 is a diagram of the basic construction of a two-input exclusive OR gate according to the present invention.

One embodiment of the present invention will be described with reference to FIG. 1. Referring to FIG. 1, there are shown magnetic flux coupling type Josephson elements or magnetic flux quantum interference type Josephson elements of this kind (Josephson interferoter elements, hereinafter abbreviated JI elements) 101 to 104, load resistors 111 and 112, a stabilizing resistor 113 and a load inductance 114. The first JI element 101 has its first gate current terminal connected to a junction 121 and its second gate current terminal to a junction 122. The second JI element 102 has its first gate current terminal connected to the junction 122 and its second gate current terminal to a junction 123. The third JI element 103 has its first gate current terminal connected to the junction 123 and its second gate current terminal connected to a junction 124. The fourth JI element 104 has its first gate current terminal connected to a junction 124 and its second gate current terminal connected to a junction 125. The first terminal of the first load resistor 111 is connected to the junction 121, and the second terminal thereof is connected to a junction 126. The first terminal of the second load resistor 112 is connected to the junction 126, and the second terminal thereof is connected to the junction 125. The stabilizing resistor 113 has its first terminal connected to the junction 121, and the second terminal connected to the junction 125. The load inductance 114 has its first terminal connected to the junction 126 and the second terminal connected to the junction 123. A DC current source 115 is connected between the junctions 121 and 125.

For the convenience of explanation, the first and second JI elements 101 and 102 are referred to as the first group of JI elements and the JI elements 103 and 104 as the second group of JI elements.

The stabilizing resistor 113 has ¼ the value of the load resistors 111 and 112 and acts to shunt the gate current when any one of the JI elements of the first group and any one of the JI elements of the second group are both brought to the voltage state, or the so-called hung-up state, so that any ones of the JI elements made to be in the voltage state are brought back to the superconducting state.

The load inductance 114 equivalently shows the input signal line to the following stage. In the following description, the current flowing from the junction 126 to the junction 123 is treated as the forward direction.

Each of the first to fourth JI elements 101 to 104 has two input signal lines. The two input signal lines of the first JI element 101 are supplied with signals A and $\bar{B}$, respectively, the two input signals of the second JI element 102 with signals $\bar{A}$ and B, respectively, the two input lines of the third JI element 103 with signals A and B, respectively, and the two input signal lines of the fourth JI element 104 with signals $\bar{A}$ and $\bar{B}$, respectively.

Each JI element 101, 102, 103, 104 can be shifted from the superconducting state to the voltage state only when the two input signals are both "1". From the viewpoint of the combination of input to each JI element, at most only one element can satisfy the above condition, or can be shifted from the superconducting state to the voltage state. When the condition of the exclusive OR given as $$X = A \cdot \bar{B} + \bar{A} \cdot B$$

has logically "1", one of the JI elements of the first group is made in the voltage state. When the above expression has "0", one of the JI elements of the second group is made in the voltage state. When one JI element of the first group is made in the voltage state, forward current flows in the load inductance 114, and thus the output is "1". When one JI element of the second group is made in the voltage state, reverse current flows in the load inductance 114 and thus the output is "0". In other words, the DC-powered circuit shown in FIG. 1 acts as an exclusive OR gate.

Figure 2A:
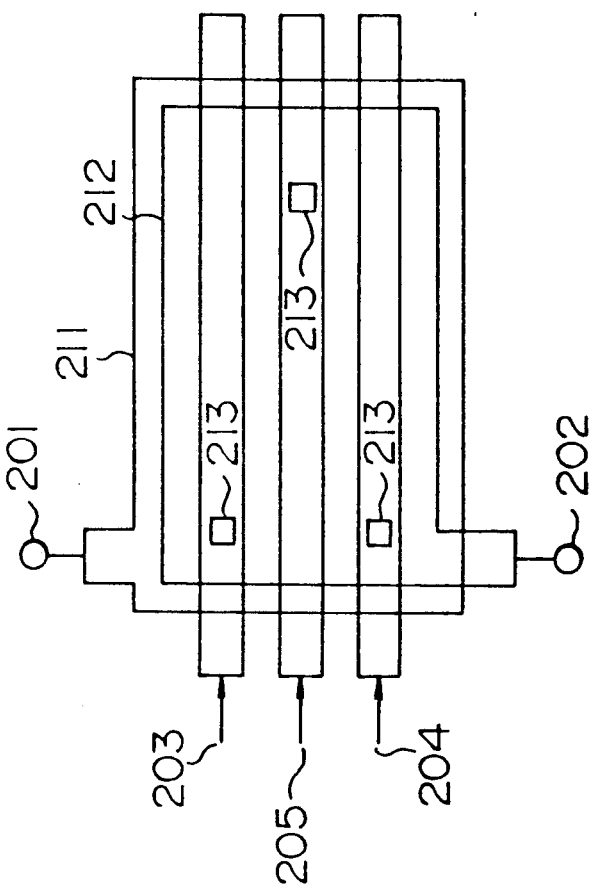
FIGS. 2A and 2B show actual structures of the JI element used in the present invention.
Figure 2B:
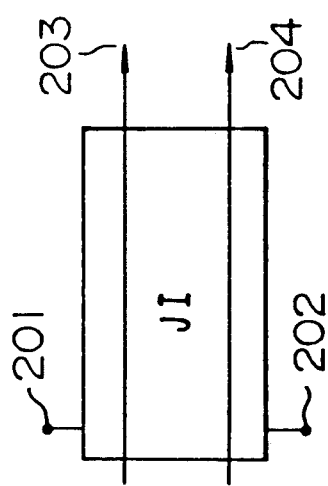

FIGS. 2A and 2B show the structure of the JI elements 101 to 104. FIGS. 2A and 2B show a first gate current terminal 201, a second gate current terminal 202 and two input signal lines 203 and 204. A Josephson junction 213 is formed between a junction lower electrode 211 connected to the first gate current terminal 201 and a junction upper electrode 212 connected to the second gate current terminal 202. On the junction upper electrode 212 are provided control lines 203 to 205 through which currents flow to generate magnetic fields which are coupled to the electrode. The control lines 203 and 204 are supplied with input signals, and the control line 205 is supplied with a DC bias current.

Figure 3A:
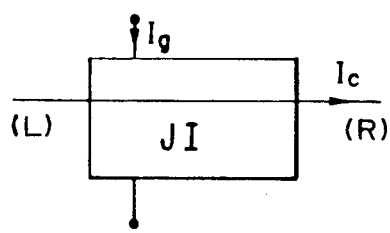
FIGS. 3A and 3B show the threshold characteristic of the JI element used in the present invention and the relation between the operation point and the DC bias current.
Figure 3B:
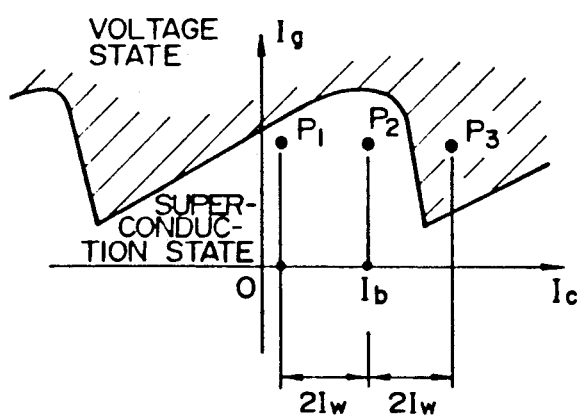

FIGS. 3A and 3B show the threshold value characteristic of the JI element in FIGS. 2A and 2B. The ordinate (Ig) is the gate current flowing from the terminal 201 to terminal 202, and the abscissa (Ic) is the control line current which flows from L to R in FIG. 3A in any one of the three control lines. The inner side of the threshold value current indicates the superconducting state and the outside thereof (shaded area) shows the voltage state. The input signal current flowing in the control line 203 or 204 has a negative or positive constant value $+Iw$ or $-Iw$. The bias current flowing in the control line 205 is represented by Ib. The total control line current Ic has a state P1 in which the two input currents are both negative, or $$Ic = Ib - 2Iw,$$

a state P2 in which one input current is positive and the other input current is negative, or $$Ic = Ib,$$

and a state P3 in which the two input currents are both positive, or $$Ic = Ib + 2Iw.$$

If the DC bias current Ib is set so that only the state P3 is out of the threshold value curve, the JI element can have a two-input AND function, in which only when two input signals are both "1", it can be shifted from the superconducting state to the voltage state.

Figure 4:
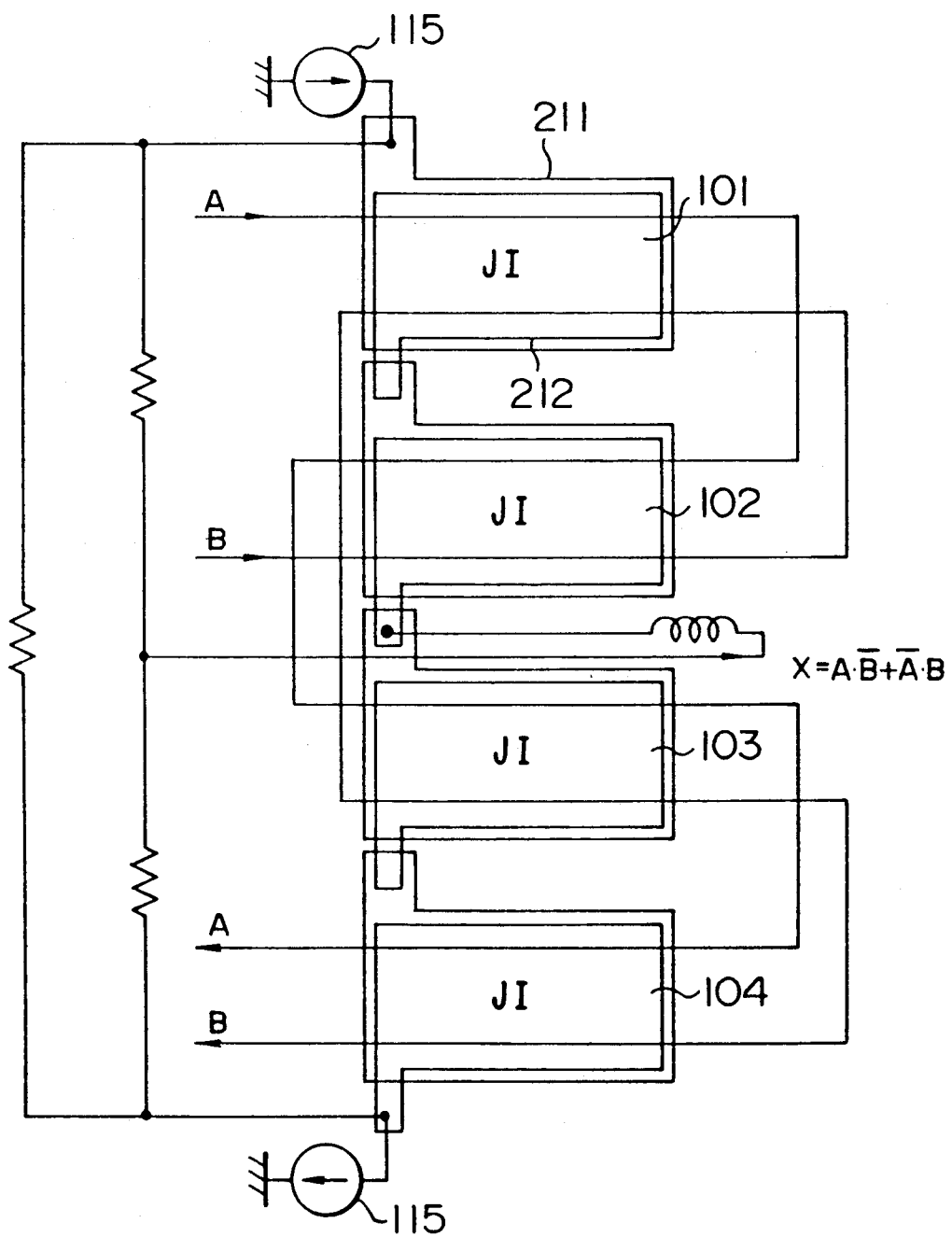
FIG. 4 shows the actual connection of input signal lines of the two-input exclusive OR gate of the present invention.

As will be obvious from the above description, a complemental signal to the JI element may be attained by reverse input of an true signal thereto. Thus, the pairs of input signals A, $\bar{A}$ and B, $\bar{B}$ to the JI elements 101 to 104 in FIG. 1 can be supplied through a pair of lines as shown in FIG. 4. In FIG. 4, the junction lower electrodes 211 and upper electrodes 212 of the respective elements are arranged and connected for better understanding since the positive and negative directions of input signals to the JI elements are interchanged depending on the order of connection between the electrodes. Also, in this figure, the DC bias line on each JI element is omitted for simple illustration. The DC bias line is similarly omitted in the following drawings.

Figure 5:
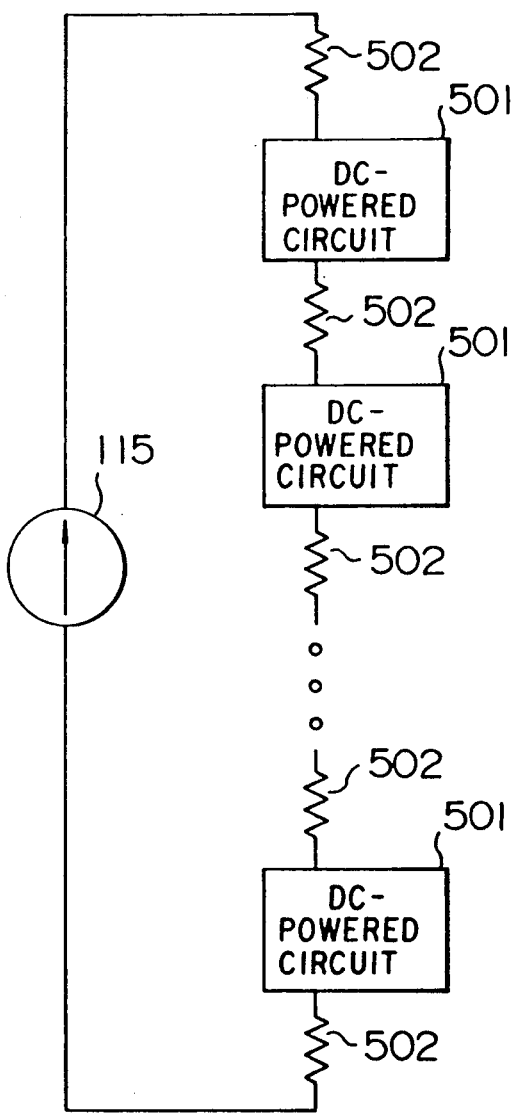
FIG. 5 shows how to supply current to the DC-powered circuit of the present invention.

On the other hand, while only one DC current source is provided for a single DC-powered circuit as shown in FIG. 1, a plurality of DC-powered circuits may of course be driven by a single DC current source as shown in FIG. 5. In FIG. 5, 501 represents a single DC-powered circuit, and 502 a separation resistor. Since in the DC-powered circuit shown in FIG. 1, normally only one element is in the voltage state, and the stabilizing resistor 113 acts as a constant voltage source, the voltage variation across a single DC-powered circuit 501 is small from transient point of view and thus the value of the separation resistor 502 may be minimized.

Figure 6:
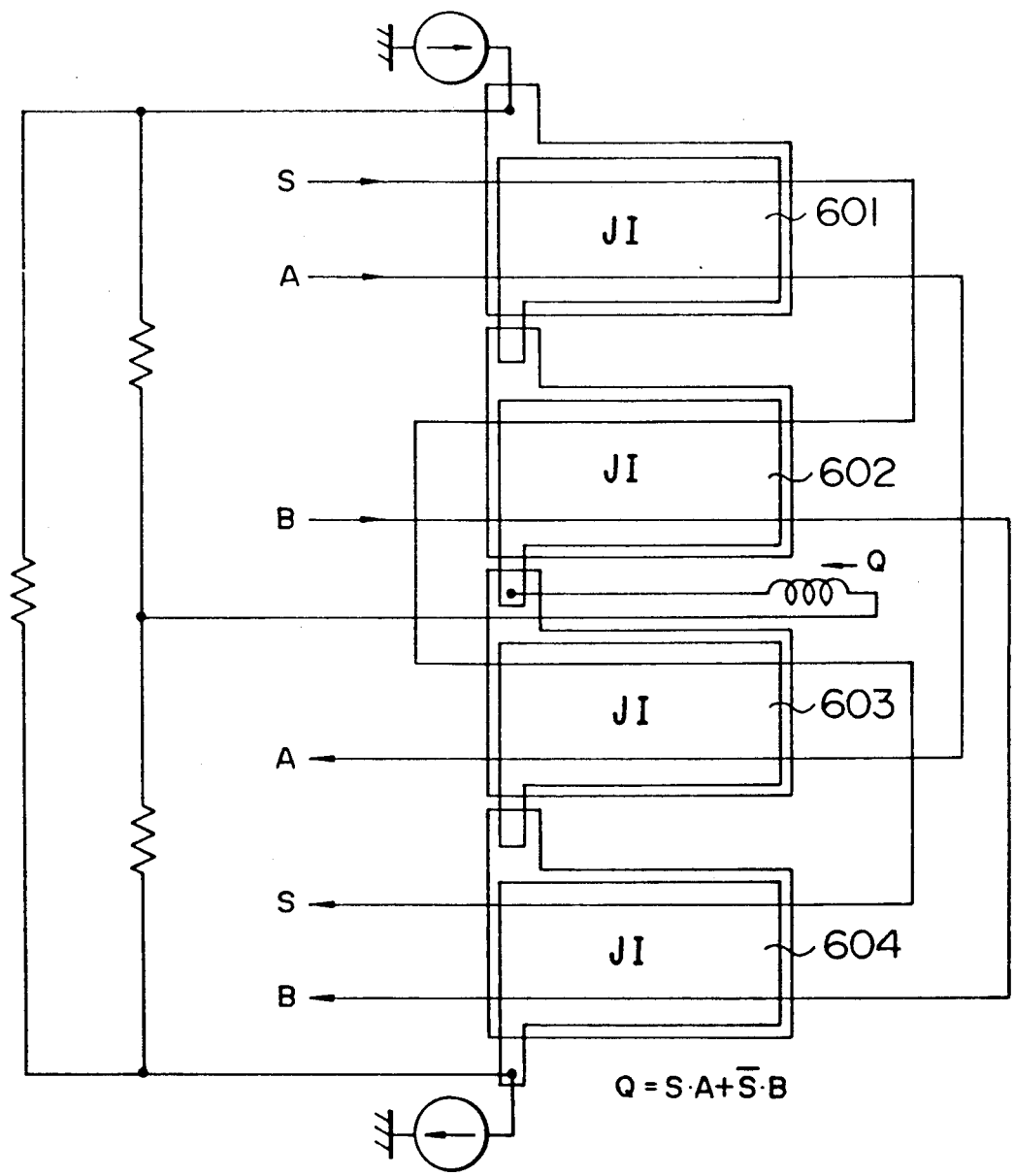
FIG. 6 is a construction diagram of the multiplexer of the present invention.

FIG. 6 shows the arrangement of a DC-powered circuit similar to that shown in FIG. 4. This arrangement is different in that the combination of input signals is changed. In other words, a selection signal S and the signal A is supplied to the two input signal lines of a first JI element 601, a selection signal $\bar{S}$ and the signal B to the two input lines of a second JI element 602, the selection signal S and the signal $\bar{A}$ to the two input lines of a third JI element 603, and the selection signal $\bar{S}$ and the signal $\bar{B}$ to the two input signal lines of a fourth JI element 604.

When the selection signal is "1", the logical output value coincides with the signal A, and when the selection signal S is "0", the logical output value coincides with the signal B. In other words, the DC-powered circuit shown in FIG. 6 functions as a selection circuit called a multiplexer.

Figure 7:
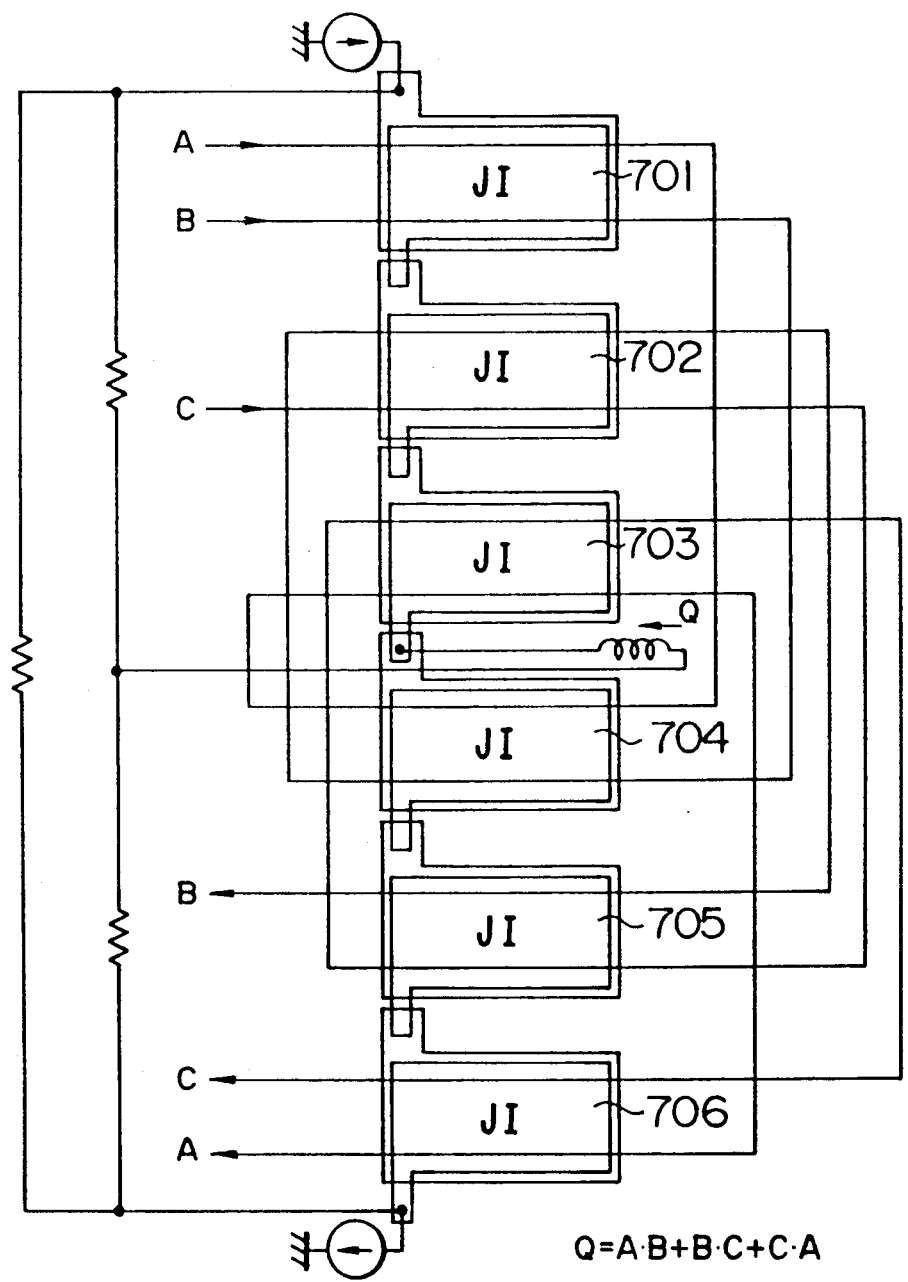
FIG. 7 is a construction diagram of the ⅜ gate of the present invention.

The arrangement shown in FIG. 7 is substantially similar to that shown in FIG. 4, and different in that the number of elements is increased to 6. In FIG. 7, the two input lines of a first JI element 701 are supplied with the signals A and B, those of a second JI element 702 with the signals B and C, those of a third JI element 703 with the signals C and A, and those of a fourth JI element 704 with the signals $\bar{A}$ and $\bar{B}$, those of a fifth JI element 705 with the signals $\bar{B}$ and $\bar{C}$, and those of a sixth JI element 706 with the signals $\bar{C}$ and $\bar{A}$.

The first to sixth JI elements 701 to 706 can be shifted from the superconducting state to the voltage state only when the two input signals are both "1" as in FIG. 4. For the convenience of explanation, the first to third JI elements 701 to 703 are called the first group elements, and the fourth to sixth JI elements 704 to 706 are called the second group elements.

When the condition of $$Y = A \cdot B + B \cdot C + C \cdot A$$

has logically "1", one JI element of the first group is made in the voltage state, and when the above condition has "0", one JI element of the second group is made in the voltage state. When one JI element of the first group is made in the voltage state, a forward current flows in the load inductance 114, so that the output is "1". When one JI element of the second group is made in the voltage state, a reverse current flows in the load inductance 114, so that the output is "0". In other words, the DC-powered circuit shown in FIG. 7 operates as a $\S$ gate which is used as a carry generation circuit in a full adder.

Figure 8:
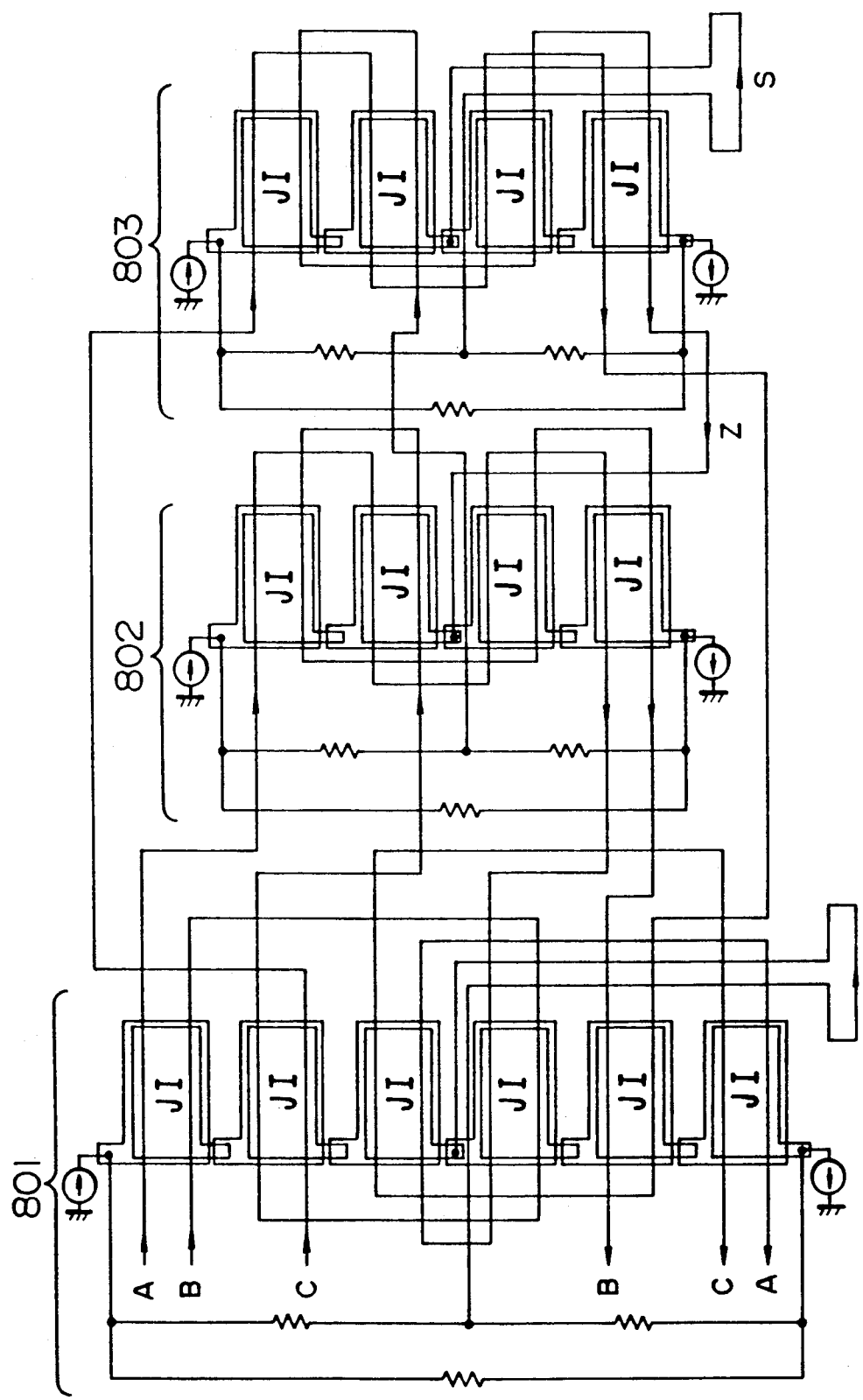
FIG. 8 is a construction diagram of the one-bit full adder of the present invention.

Two 2-input exclusive OR gates one of which is shown in FIG. 4, and the $\S$ gate shown in FIG. 7 are used to construct a one-bit full adder as shown in FIG. 8. In FIG. 8, 801 represents a circuit for generating a carry Y from three input signals A, B and C in accordance with the logical expression of $$Y = A \cdot B + B \cdot C + C \cdot A$$

802 represents a circuit for generating $$Z = A \cdot \bar{B} + \bar{A} \cdot B$$

from two input signals A and B. 803 represents a circuit for generating a sum signal S from two input signals C and Z in accordance with the expression of $$S = C \cdot \bar{Z} + \bar{C} \cdot Z$$

Figure 9:
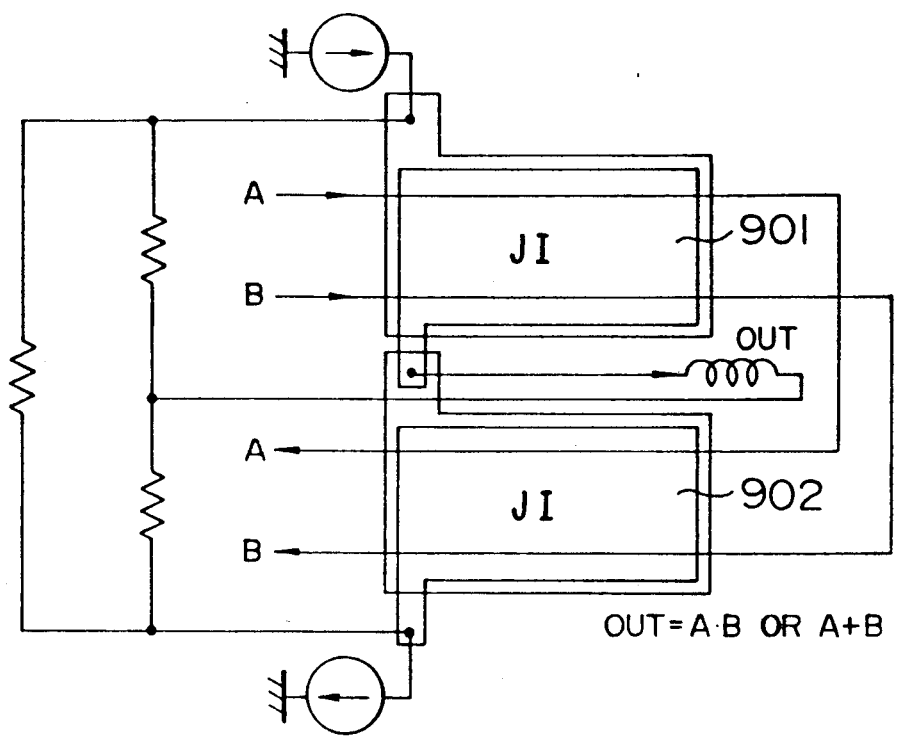
FIG. 9 is a construction diagram of the two-input AND gate of the present invention.

FIG. 9 shows the arrangement of a 2-input AND gate, which is simpler than the above given circuits. This gate is substantially similar to that shown in FIG. 4, and different in that the number of JI elements is reduced to 2. The two input signal lines of a first JI element 901 are supplied with the signals A and B, and those of a second JI element 902 with the signals $\bar{A}$ and $\bar{B}$, respectively.

Figure 10A:
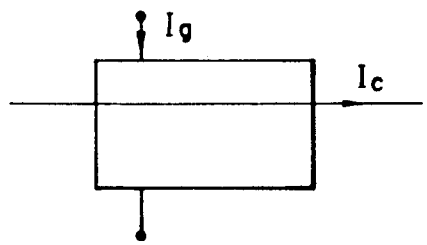
FIGS. 10A and 10B show the threshold value characteristic of the JI element used in the present invention and the relation between the operating point and the DC bias current.
Figure 10B:
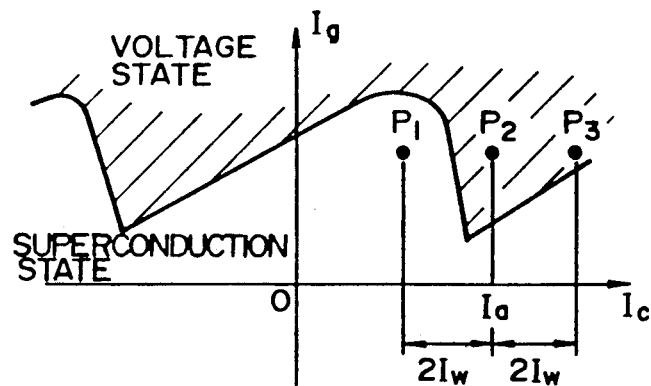

In the second JI element 902 of this gate, how to supply the DC bias current is applied to the control line 205 shown in FIGS. 2A and 2B in a different manner. FIGS. 10A and 10B again show the threshold value characteristic of the JI element shown in FIGS. 2A and 2B. In this element, unlike FIGS. 3A and 3B, the DC bias current Ia is set so that the states P2 and P3 are out of the threshold value curve, in which case P1 is the state in which the two input signals are both negative, or the expression of $$Ic = Ia - 2Iw$$

is satisfied, P2 is the state in which one input signal is positive, the other is negative, or $$Ic = Ia$$

is satisfied, and P3 is the state in which the two input signals are both positive, or the expression of $$Ic = Ia + 2Iw$$

is satisfied. Thus, this JI element can function as a 2-input OR, and if any one of the two input signals "1", it can be shifted from the superconducting state to the voltage state.

In other words, the first JI element 901 is made in the voltage state when the condition of $$F = A \cdot B$$

has "1", and the second JI element 902 is made in the voltage state when the condition of $$\bar{F} = \bar{A} \cdot \bar{B} = \bar{A} + \bar{B}$$

has "1". Thus, the whole gate operates as a 2-input AND gate.

Similarly for a 2-input OR gate, the DC bias current Ia is supplied to the first JI element and the DC bias current Ib is supplied to the second JI element.

Figure 11:
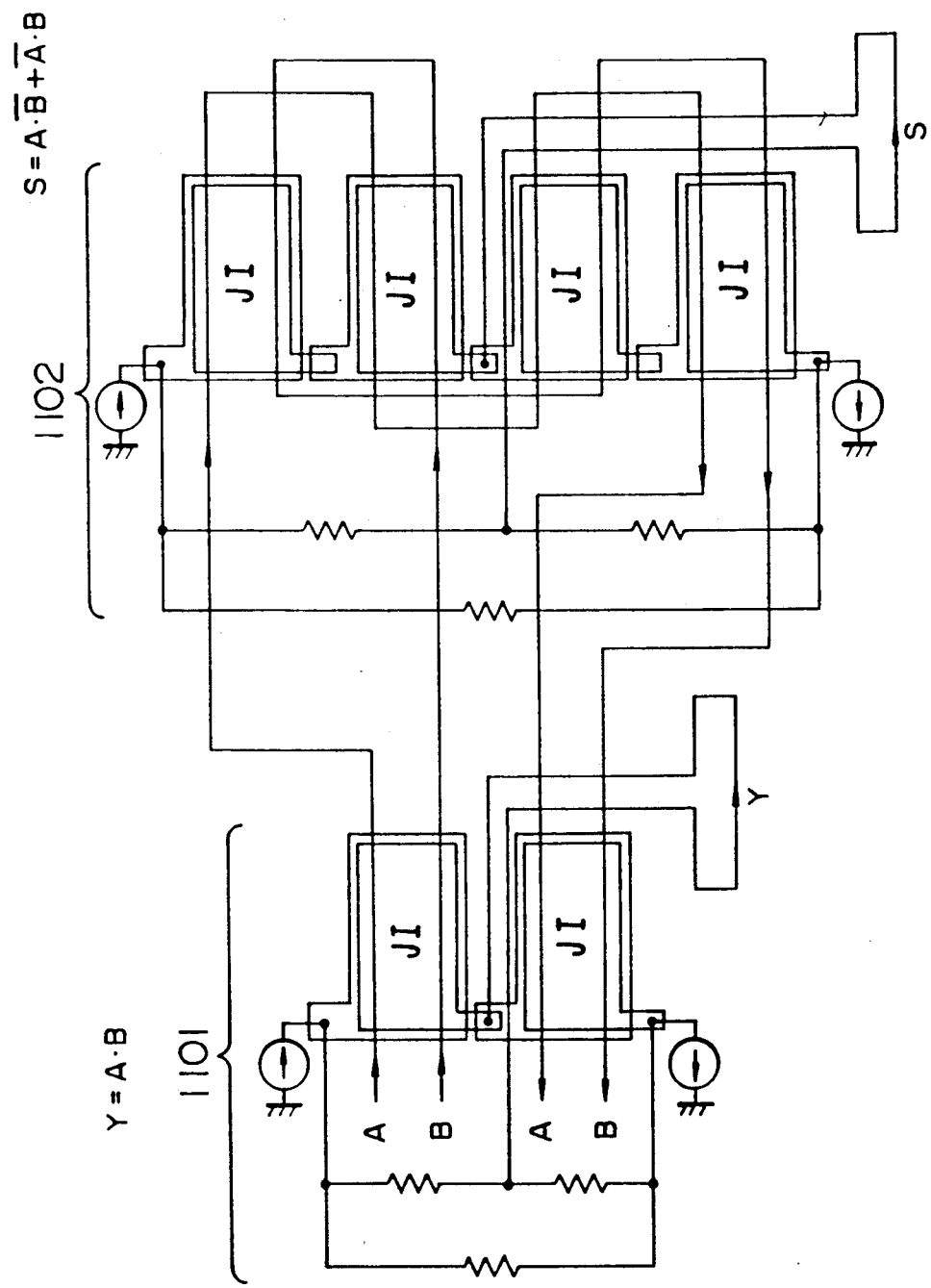
FIG. 11 is a construction diagram of the one-bit half adder of the present invention.

One 2-input AND gate shown in FIG. 9 and one 2-input exclusive OR gate shown in FIG. 4 are used to construct a one-bit half adder as shown in FIG. 11. In FIG. 11, 1101 represents a circuit for generating the carry Y from the two input signals A and B in accordance with the expression of $$Y = A \cdot B$$

1102 represents a circuit for generating the sum S from the two input signals A and B in accordance with the expression of $$S = A \cdot \bar{B} + \bar{A} \cdot B$$

A latch using a DC-powered circuit is shown in FIG. 12. This latch is constructed by connecting DC-powered circuits which are originally flip-flops, in a master-slave configuration. The DC-powered circuit formed of a first JI element 1201 and a second JI element 1202 is a master flip-flop 1205, and the DC-powered circuit formed of a third JI element 1203 and a fourth JI element 1204 is a slave flip-flop 1206.

The first to fourth JI elements 1201 to 1204 each have two input signal lines. The two input signal lines of the first JI element 1201 are respectively supplied with a data signal D and a hold signal H, those of the second JI element 1202 with a data signal $\bar{D}$ and the hold signal H, those of the third JI element 1203 with an output M from the master flip-flop 1205 and a hold signal $\bar{H}$, and those of the fourth JI element 1204 with an output $\bar{M}$ from the master flip-flop 1205 and the hold signal $\bar{H}$.

The DC bias lines of the first to fourth JI elements 1201 to 1204 are supplied with the current value Ib shown in FIGS. 3A and 3B. Each element can be shifted from the superconducting state to the voltage state only when the two input signals are both "1". From the viewpoint of the combination of input signals in each element, only one element can satisfy the above condition, or be shifted from the superconducting state to the voltage state. When the hold signal H is "1", the master flip-flop 1205 is responsive to the data signal D to produce the output M coincident with the input. When the hold signal H is "0", the slave flip-flop 1206 is responsive to the output M of the master flip-flop to produce an output Q coincident with the input. In other words, the DC-powered circuit shown in FIG. 12 operates as a latch.

Figure 13A:
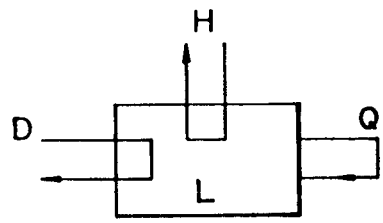
FIGS. 13A, 13B and 13C are construction diagram of the present 4-bit load function added register of the inventions.
Figure 13B:
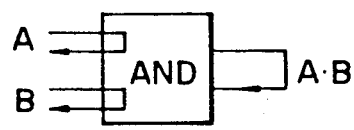
Figure 13C:
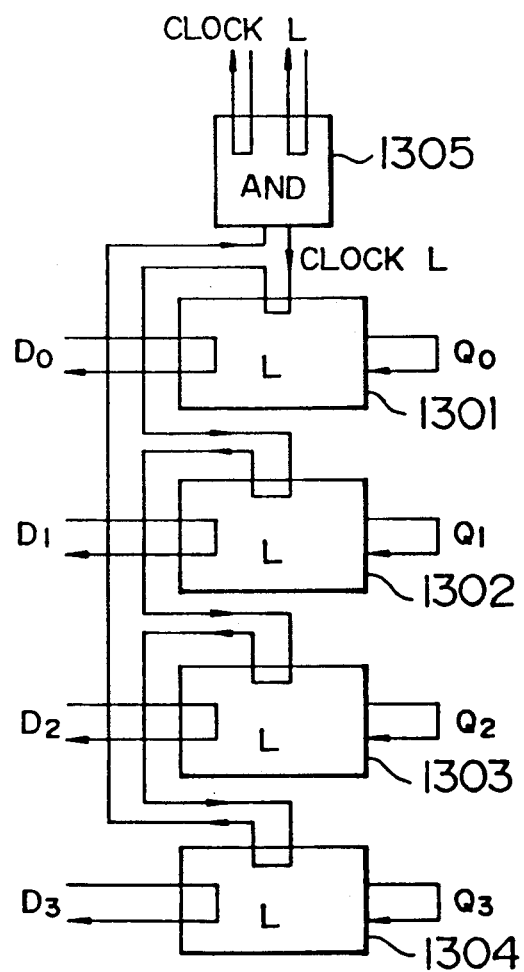

A 4-bit register having a load function as shown in FIG. 13C can be constructed by use of the latch of FIG. 12 shown in symbolic fashion in FIG. 13A and the AND gate of FIG. 9 shown in symbolic fashion in FIG. 13B. In FIG. 13C, the register including 1301 to 1304 latches for holding the 0 to third bit data $D_0$ to $D_3$, and 1305 representing an AND gate for producing the logical product of a clock input (Clock) and a load signal L. The Clock·L is supplied to each bit as the hold signal H.

A latch having the reset function is constructed as shown in FIG. 14. In other words, part of a master flip-flop 1205 in the latch shown in FIG. 12 is added with the fifth JI element 1401, so that an arrangement 1402 can be formed as shown in FIG. 14. The fifth JI element 1401 is connected in series with the second JI element 1202.

In this latch, the logical product Clock·$\overline{\text{Reset}}$ between the clock input Clock and a reset complementary signal $\overline{\text{Reset}}$ is supplied to the master flip-flop as the hold signal H. The fifth JI element 1401 has one input signal line only for receiving the reset signal Reset. The DC bias line of this element is supplied with the current value Ia shown in FIGS. 10A and 10B. When the Reset signal is "1", this element can be shifted from the superconducting state to the voltage state. Also, the output M of the master flip-flop is made coincident with the reset signal Reset irrespective of the value of the clock input Clock. When the clock input Clock is "0" or when the reset signal Reset is "1", the slave flip-flop receives the output M of the master flip-flop to produce the output Q coincident with the input.

For the construction of a multi-bit register having the reset function, one AND gate for producing the logical product Clock·$\overline{\text{Reset}}$ is provided common to the respective bits.

A register file having a multi-word length of multi-bit registers is constructed by a matrix arrangement of bit elements as shown in FIG. 15. This register file is also the master-slave connection of DC-powered circuits which are originally flip-flops. A DC-powered circuit formed of a first JI element 1501 and a second JI element 1502 functions as a bit holding flip-flop 1505 for the bits, and another DC-powered circuit formed of a sense gate portion 1506 including a true side sense gate 1503 of a third JI element and a complemental side sense gate 1504 of a fourth JI element, and another sense gate portion for other words functions as a read flip-flop.

The first to fourth JI elements 1501 to 1504 each have two input signal lines. The two input signal lines of the first JI element 1501 are supplied with an i-th bit data signal $\bar{D}i$ and a j-th word write enable signal Wj, those of the second JI element 1502 with an i-th bit data signal Di and the j-th word write enable signal Wj, those of the third JI element 1503 with an output Mij of the bit holding flip-flop 1505 and a j-th word read enable signal Rj, and those of the fourth JI element 1504 with an output $\overline{Mij}$ of the bit holding flip-flop 1505 and the j-th word read enable signal Rj, respectively.

The DC bias lines of the first to fourth JI elements 1501 to 1504 are supplied with the current value Ib shown in FIGS. 3A and 3B. Only when the two input signals are both "1", the elements can be shifted from the superconducting state to the voltage state. From the viewpoint of the combination of inputs to each JI element, only one element can satisfy the above condition, or be shifted from the superconducting state to the voltage state. When the j-th word write enable signal Wj is "1", the bit holding flip-flop 1505 receives the i-th bit data signal Di to produce the output Mij coincident with the input. When the j-th word read enable signal Rj is "1", the sense gate portion 1506 receives the output Mij of the bit holding flip-flop so that the output Qi of the i-th bit read flip-flop is made coincident with the input.

In FIG. 15, 1511 and 1512 represent DC power terminals for the bit holding flip-flop, 1521 and 1522 true sense gate terminals, 1531 and 1532 complemental sense gate terminals, 1541 and 1542 i-th bit data signal terminals, 1551 and 1552 j-th word write enable signal Wj terminals, and 1561 and 1562 j-th word read enable signal Rj terminals.

Figure 16:
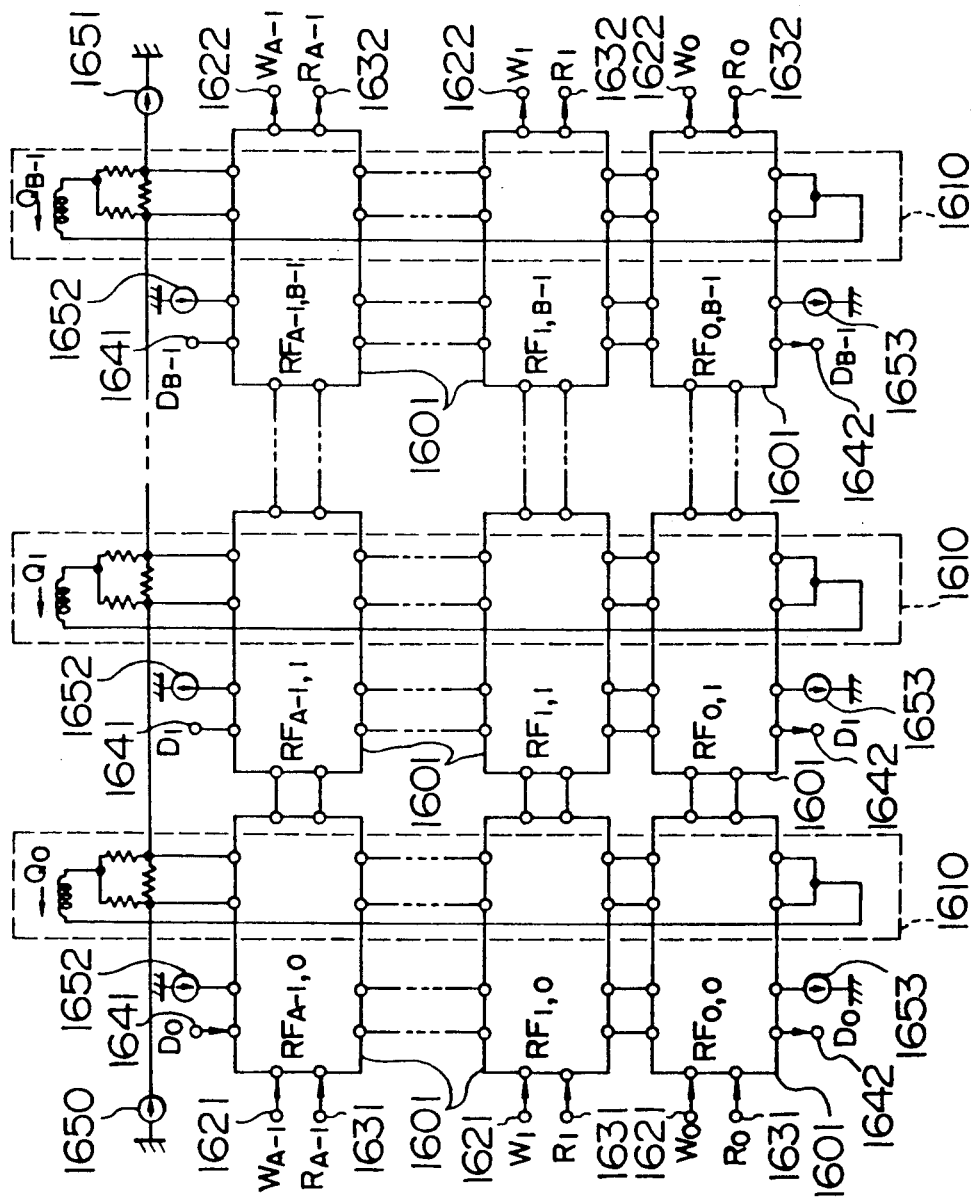
FIG. 16 is a construction diagram of the register file of the present invention.

FIG. 16 shows the construction of an A-row B-column register file using the bit elements shown in FIG. 15. A represents the word length and B the bit length. In FIG. 16, 1601 denotes the bit element shown in FIG. 15. The sense gates in the i-th column of bit elements are connected in series to form a read flip-flop 1610. 1621 and 1622 denote terminals through which a write enable signal is supplied to the bit elements in each row, 1631 and 1632 terminals through which a read enable signal is supplied to the bit elements in each row, and 1641 and 1642 terminals through which a data signal is supplied to the bit elements in each column. In addition, 1650 and 1651 designates DC current sources for driving the read flip-flop, and 1652 and 1653 DC current sources for driving the bit elements in each column.

Figure 17A:
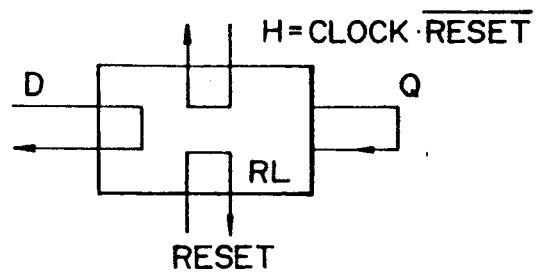
FIGS. 17A, 17B, 17C and 17D are construction diagrams of the present counter of the invention.
Figure 17B:
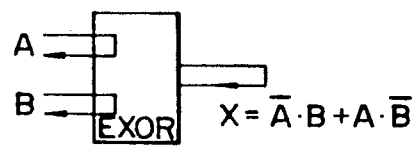
Figure 17C:
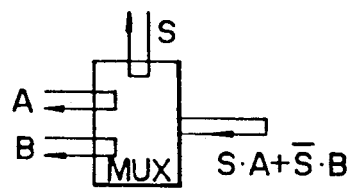
Figure 17D:
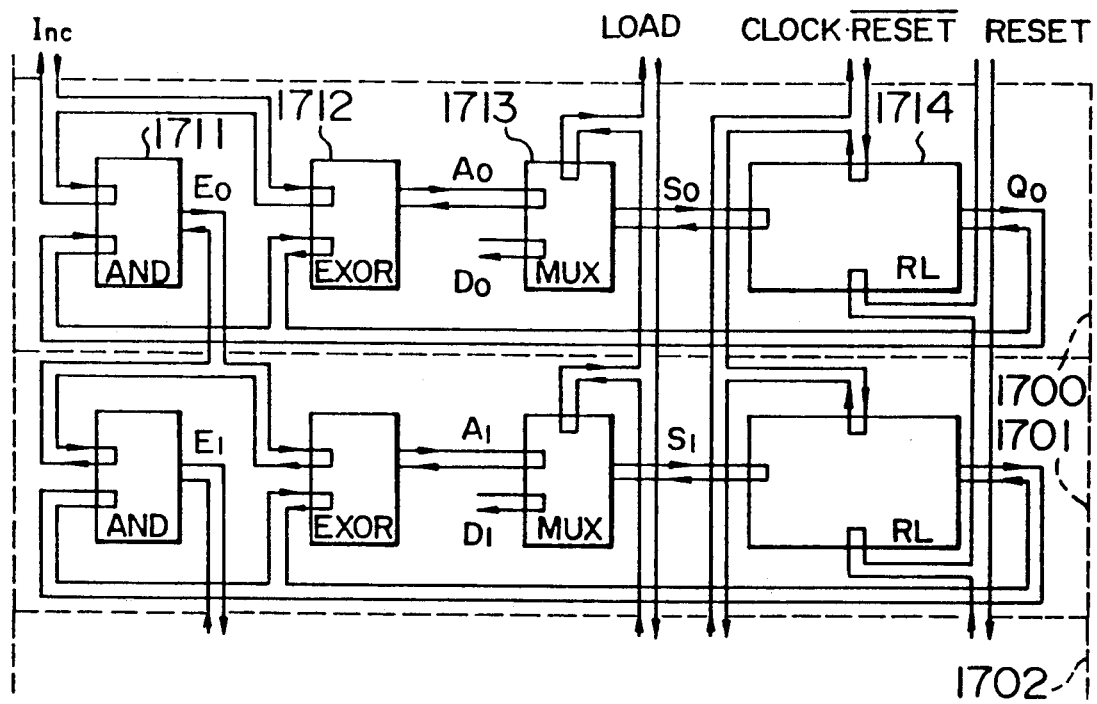

A counter circuit as shown in FIG. 17D is constructed by use of the AND gate shown in FIG. 9, the reset function added latch of FIG. 14 and shown symbolically in FIG. 17A; the exclusive OR gate of FIG. 4 shown symbolically in FIG. 17B, and a multiplexer of FIG. 6 shown symbolically in FIG. 17C. The o-th bit 1700 of the counter circuit comprises an AND gate 1711 for producing the logical product $$E_0 = Inc \cdot Q_0$$

between a count enable signal Inc and an output $Q_0$ of the bit, an EXOR gate 1712 for producing the exclusive logic sum $$A_0 = \overline{Inc} \cdot Q_0 + Inc \cdot \overline{Q_0}$$

between the Inc signal and the output $Q_0$ of the bit, a multiplexer 1713 for producing $$S_0 = Load \cdot D_0 + \overline{Load} \cdot A_0$$

by selecting external data input $D_0$ and $A_0$ signal in response to the Load signal, and a reset function added latch 1714 for receiving the input signal $S_0$ in response to the hold signal of Clock·Reset to produce output $Q_0$. In FIG. 17D, since the signals are currents, the forward currents are logically "1" as indicated by arrows.

A counter circuit for other bits is constructed by connecting the same bit elements in series with 1701 and 1702. In this case, the count enable signal to the second bit 1701 is the $E_0$ output of the o-th bit, and the count enable signal to the third bit 1702 is the $E_1$ output of the first bit.

Figure 18:
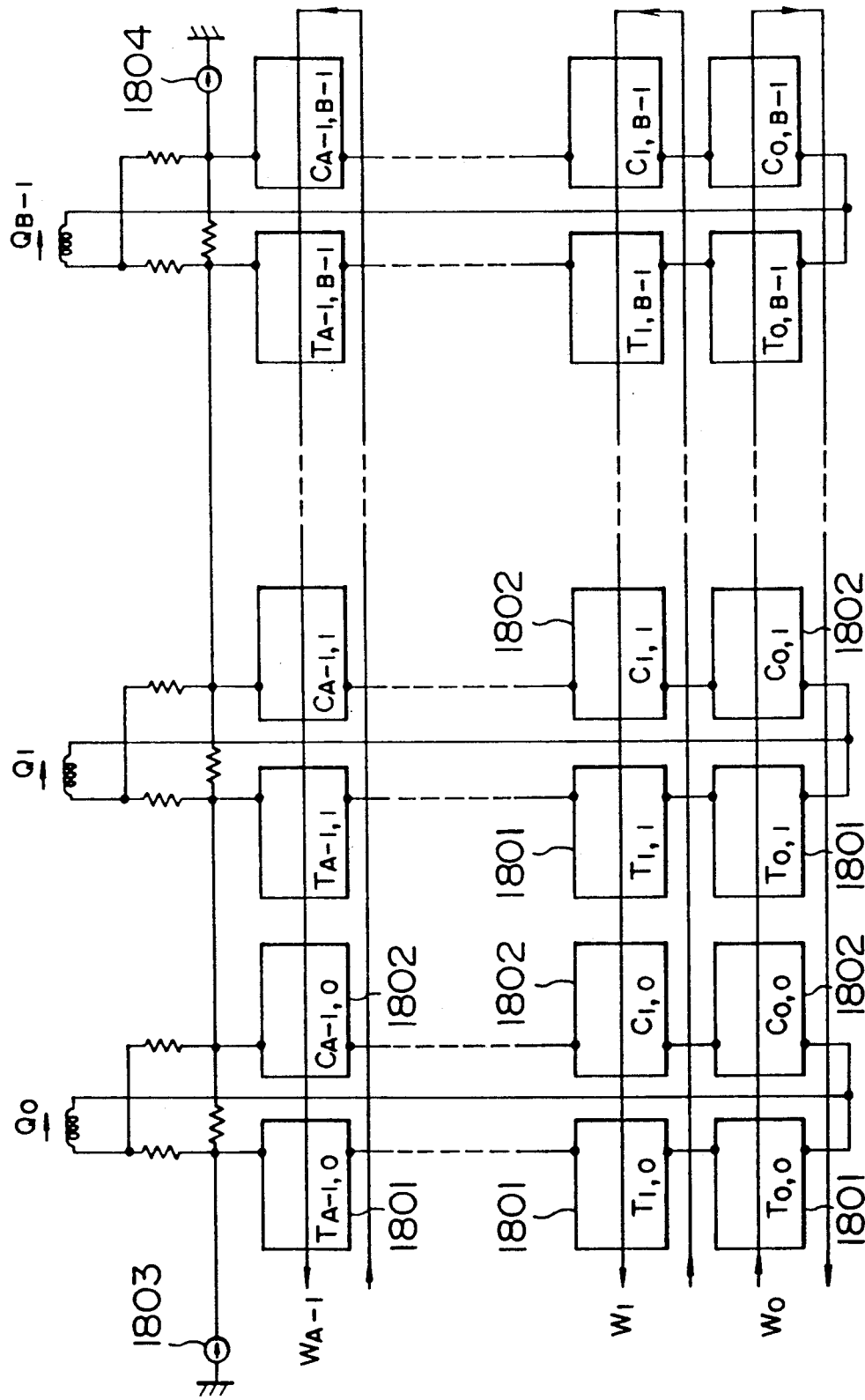
FIG. 18 is a construction diagram of the ROM of the present invention.

A ROM circuit is constructed by an A-row B-column matrix arrangement of JI elements as shown in FIG. 18. Each row of the ROM has A flip-flops connected in series, each of which has a true value side ROM cell 1801 and a complementary side ROM cell 1802. The output current $Q_i$ of each flip-flop is equal to the output signal of the corresponding column. The j-th row of the ROM is added with a row selection signal $W_j$.

The ROM cell in which logic "1" is written is a JI element which has one input signal line. This JI element is supplied with the current value Ib shown in FIG. 3. When the input signal is "1", it can be shifted from the superconducting state to the voltage state. On the other hand, the ROM cell in which logic "0" is written is a JI element of which the junction size is several times larger so that the junction upper and lower electrodes are effectively shorted. Thus, even when the input signal is "1", the element is still in the superconducting state. The true value side ROM cell $T_{ji}$ and the complementary side ROM cell $C_{ji}$ make a pair in which complementary logic values are written. In other words, when a part of the pair is "1", the other part is sure to be "0". Since only one of the A row selection signals $W_j$ can take "1", at most one element in each column can be shifted from the superconducting state to the voltage state. When the j-th row selection signal $W_j$ is "1", the i-th column flip-flops receive the i-th row, j-th column write data to produce the output $Q_i$ coincident with the input.

In FIG. 18, 1803 and 1804 represent DC current sources for the ROM circuit. If the j-th row ROM cell and the (j+1)-th row ROM cell are reversely arranged in the vertical direction, the excess interlayer connection can be omitted. In addition, the direction of the row selection signal $W_j$ is also reversed in every other rows.

Figure 19:
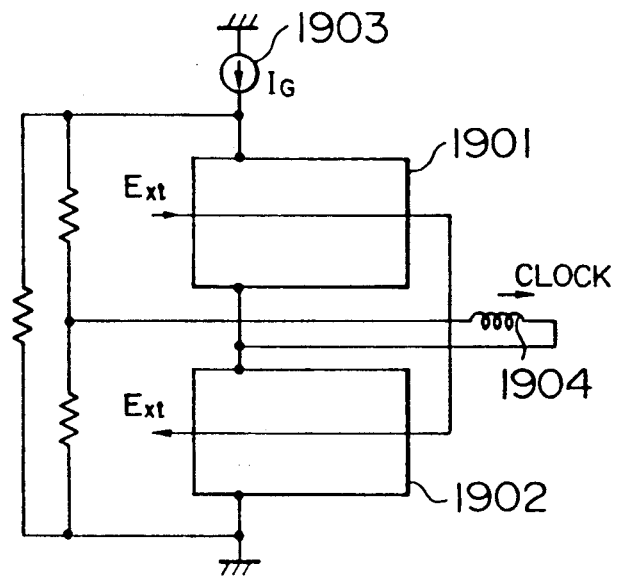
FIG. 19 is a construction diagram of the clock generation circuit of the present invention.

FIG. 19 shows the construction of a clock generation circuit. In FIG. 19, 1901 and 1902 indicate JI elements each of which has only one input signal line. The JI elements are supplied with the current value Ib shown in FIG. 3. When the input signal is "1", each element can be shifted from the superconducting state to the voltage state. 1903 denotes a DC current source. When an external input Ext is supplied to the JI elements 1901 and 1902 as illustrated, a waveform shaped and amplified clock can be flowed in a load inductance 1904. Since the leading edge of the output waveform is deteriorated by the excessive increase of the load inductance, it is necessary that similar clock generation circuits be properly cascaded to form a clock system so that the fan out is not too large. When the clock signal can be independently generated within a chip, the DC current source 1903 at the first stage of the clock system within the chip can be changed independently of other portions, and a source current 0 to 50% excessively larger than the operating range of the normal flip-flop is supplied thereat, making self-oscillation. The oscillation frequency is dependent not only on the load inductance value and the load resistance value but also the source current value, and thus it can be controlled by current.

Figure 20:
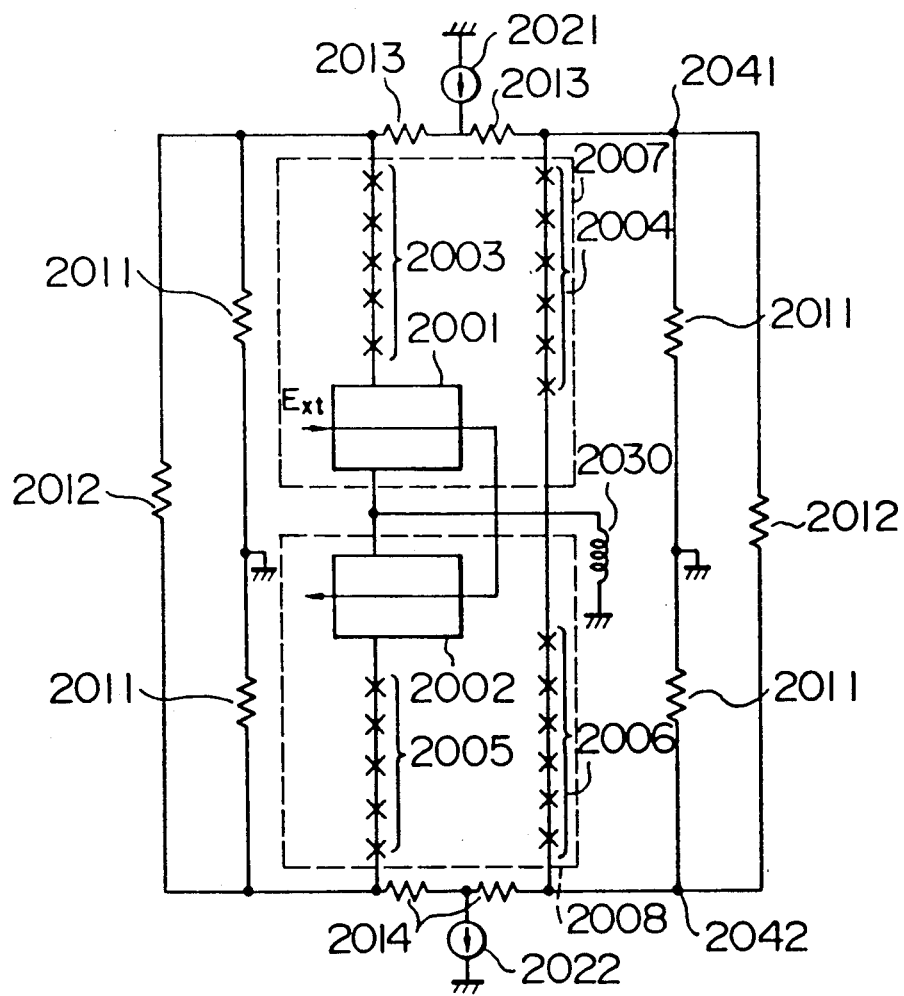
FIG. 20 is a construction diagram of the voltage amplifying circuit of the present invention.
Figure 21:
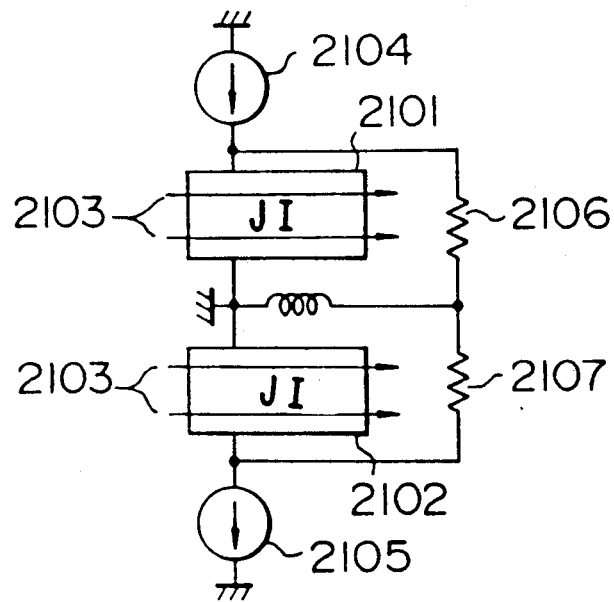
FIG. 21 is a construction diagram of a conventional DC-powered circuit.
Figure 22:
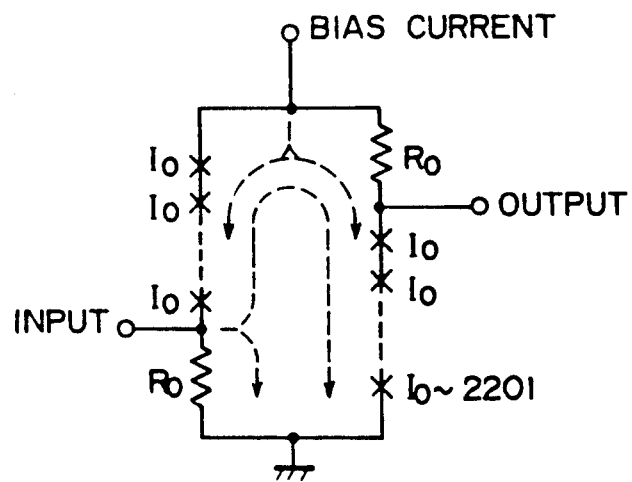
FIG. 22 is a construction diagram of a conventional voltage amplifying circuit.

FIG. 20 shows the construction of a voltage amplifying circuit. In FIG. 20, there are shown JI elements 2001 and 2002 each of which has only one input signal line. Each of the JI elements is supplied with the current value Ib shown in FIG. 3. If the input signal is "1", the element can be shifted from the superconducting state to the voltage state. There are also shown Josephson junction series 2003 to 2006. The junction series 2003 or 2005 is one junction smaller than the junction series 2004 or 2006. The critical current value of the Josephson junctions is set to the maximum critical current value of the JI elements 2001 and 2002. The JI element 2001 and the Josephson junction series 2003 and 2004 form a first Josephson element group 2007, and the JI element 2002 and the Josephson junction series 2005 and 2006 form a second Josephson element group 2008. 2021 and 2022 represent DC current sources.

When the JI element 2001 is switched to the voltage state by the external input Ext, the Josephson junction series 2003 and 2004 can be shifted from the superconducting state to the voltage state by the switching noise. Thus, the first Josephson element group is all shifted to the voltage state. A shunt resistor 2013 is very small, and thus does not prevent the propagation of the switching noise. In this case, the second Josephson element group is all shifted from the voltage state to the superconducting state by the reaction through a load resistor 2011, a load inductance 2030 and a parallel resistor 2012. In this way, a waveform shaped and amplified voltage output signal can be produced between ground and output terminals 2041 and 2042. The voltage amplitude is slightly smaller than (the number of stages of Josephson junction series 2004 and 2006) × (the gap voltage of the Josephson junctions).

According to the invention as described above, since a DC-powered logic gate of which the number of elements and switching stages to be used is small can be provided, the DC-powered circuit is suited for low power consumption, high density integration, and high speed operation.

Moreover, according to this invention, since a DC-powered gate of which the output voltage amplitude is large can be provided, the interface between a DC-power Josephson circuit and a semiconductor can be made easy.

What is claimed is:

1. A DC-powered Josephson integrated circuit comprising:
    a first magnetic flux coupling type Josephson element;
    a first load resistor of which one terminal is connected to one terminal of said first magnetic flux coupling type Josephson element at a first junction;
    a second magnetic flux coupling type Josephson element;
    a second load resistor of which one terminal is connected to one terminal of said second magnetic flux coupling type Josephson element at a second junction, the other terminals of said first and second magnetic flux coupling type Josephson elements being connected together at a third junction, the other terminals of said first and second resistors being connected together at a fourth junction;
    an inductance connected between said third junction and said fourth junction;
    a third resistor connected between said first and second junctions;
    a DC current source connected between said first and second junctions; and
    means for supplying control signals to a plurality of control input lines of each of said Josephson elements; said first and second Josephson elements, said first and second load resistors, said inductance, said third resistor, said DC current source and said control signal supplying means constituting a logic circuit, wherein said first and second magnetic flux coupling type Josephson elements are respectively first and second element series circuits each having a plurality of magnetic flux coupling type Josephson elements connected in series.

2. A DC-powered Josephson integrated circuit according to claim 1, wherein said magnetic flux coupling type Josephson element is a Josephson interferometer element to which control signals from the external and a DC bias current are supplied at a time.

3. A DC-powered Josephson integrated circuit according to claim 1, wherein the control signals supplied to the control input lines of each of said Josephson elements control any one of the Josephson elements of said first element series circuit to be made in a voltage state, and all the Josephson elements of said second element series circuit to be made in a superconducting state.

4. A DC-powered Josephson integrated circuit according to claim 2, wherein the control signals supplied to the control input lines of each of said Josephson elements control any one of the Josephson elements of said first element series circuit to be made in a voltage state, and all the Josephson elements of said second element series circuit to be made in a superconducting state.

5. A DC-powered Josephson integrated circuit according to claim 1, wherein when the control signals to the control input lines of each of said Josephson elements are all "1", said corresponding Josephson element is supplied with a DC bias current so as to be controlled to be in a voltage state.

6. A DC-powered Josephson integrated circuit according to claim 2, wherein when the control signals to the control input lines of each of said Josephson elements are all "1", said corresponding Josephson element is supplied with a DC bias current so as to be controlled to be in a voltage state.

7. A DC-powered Josephson integrated circuit according to claim 3, wherein when the control signals to the control input lines of each of said Josephson elements are all "1", said corresponding Josephson element is supplied with a DC bias current so as to be controlled to be in a voltage state.

8. A DC-powered Josephson integrated circuit according to claim 4, wherein when the control signals to the control input lines of each of said Josephson elements are all "1", said corresponding Josephson element is supplied with a DC bias current so as to be controlled to be in a voltage state.

9. A DC-powered Josephson integrated circuit comprising:
    a first magnetic flux coupling type Josephson element;
    a first load resistor of which one terminal is connected to one terminal of said first magnetic flux coupling type Josephson element at a first junction;
    a second magnetic flux coupling type Josephson element;
    a second load resistor of which one terminal is connected to one terminal of said second magnetic flux coupling type Josephson element at a second junction, the other terminals of said first and second magnetic flux coupling type Josephson elements being connected together at a third junction, the other terminals of said first and second resistors being connected together at a fourth junction;
    an inductance connected between said third junction and said fourth junction;
    a third resistor connected between said first and second junctions;
    a DC current source connected between said first and second junctions; and
    means for supplying control signals to a plurality of control input lines of each of said Josephson elements; said first and second Josephson elements, said first and second load resistors, said inductance, said third resistor, said DC current source and said control signal supplying means constituting a logic circuit, wherein said first and second magnetic flux coupling type Josephson elements are respectively first and second element series-parallel circuits each having a plurality of magnetic flux coupling type Josephson elements including at least one Josephson interferometer element connected in series and in parallel.

* * * * *

UNITED STATES PATENT AND TRADEMARK OFFICE
CERTIFICATE OF CORRECTION

PATENT NO. : 5,124,583

DATED : June 23, 1992

INVENTOR(S) : Hatano et al

It is certified that error appears in the above-identified patent and that said Letters Patent is hereby corrected as shown below:

| Column | Line |  |
|--------|------|---|
| 1 | 62 | Change "All Japan" to --All-Japan--. |
| 2 | 14 | Delete "to". |
| 2 | 22 | After "elements" insert --,--. |
| 2 | 46 | Change "flow" to --flows--. |
| 3 | 17 | Change "gate has" to --gates have--. |
| 4 | 14 | Change "operation" to --operating--. |
| 4 | 37 | Change "diagram" to --diagrams--. |
| 4 | 38 | Delete "present". |
| 4 | 39 | Change "inventions" to --present invention--. |
| 4 | 43 | Before "register" delete "present"; before "invention" insert --present--. |
| 4 | 47 | Before "counter" delete "present"; before "invention" insert --present--. |
| 4 | 62 | After "DESCRIPTION" delete "OF PREFERRED". |
| 4 | 63 | Delete "EMBODIMENTS". |
| 6 | 52 | Before "true" change "an" to --a--. |
| 7 | 59 | After "gates" insert --,--. |
| 8 | 18 | Delete "how to". |
| 8 | 19 | Delete "supply". |
| 8 | 42 | Before "1" isnert --is--. |
| 8 | 52 | Change "$\overline{F}=\overline{A}\cdot B=\overline{A}+\overline{B}$" to --$\overline{F}=\overline{A\cdot B}=\overline{A}+\overline{B}$--. |
| 9 | 45 | Before "latches" insert --representing--. |
| 11 | 26 | Change "signal" to --signals--. |
| 12 | 21 | Delete "excessively". |

UNITED STATES PATENT AND TRADEMARK OFFICE
CERTIFICATE OF CORRECTION

PATENT NO. : 5,124,583
DATED : June 23, 1992
INVENTOR(S) : Hatano et al It is certified that error appears in the above-identified patent and that said Letters Patent is hereby corrected as shown below:

| Column | Line | |
|---|---|---|
| 12 | 23 | Change "making" to --creating--. |

Signed and Sealed this

Ninth Day of November, 1993

Attest:

Attesting Officer

BRUCE LEHMAN

Commissioner of Patents and Trademarks